United States Patent
Gurov et al.

(10) Patent No.: US 11,852,684 B2
(45) Date of Patent: *Dec. 26, 2023

(54) METHODS AND SYSTEMS FOR DETECTING DEFECTS ON AN ELECTRONIC ASSEMBLY

(71) Applicant: Optimal Plus Ltd., Holon (IL)

(72) Inventors: Leonid Gurov, Rishon LeZion (IL); Gal Peled, Ezer (IL); Dan Sebban, Rishon LeZion (IL); Shaul Teplinsky, San Francisco, CA (US)

(73) Assignee: Optimal Plus Ltd., Holon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/194,264

(22) Filed: Mar. 31, 2023

(65) Prior Publication Data

US 2023/0236245 A1  Jul. 27, 2023

Related U.S. Application Data

(63) Continuation of application No. 16/981,951, filed as application No. PCT/IL2019/050311 on Mar. 20, 2019, now Pat. No. 11,650,250.
(Continued)

(51) Int. Cl.
*G01R 31/317* (2006.01)
*G01R 31/3185* (2006.01)
(Continued)

(52) U.S. Cl.
CPC ........ *G01R 31/318511* (2013.01); *G01R 31/31718* (2013.01); *H01L 22/12* (2013.01)

(58) Field of Classification Search
CPC ........ G01R 31/318511; G01R 31/2831; G01R 31/31718; H01L 22/12; H01L 22/00;
(Continued)

(56) References Cited

U.S. PATENT DOCUMENTS 6,493,645 B1 * 12/2002 Hladschik ............... H01L 22/12
702/182
7,987,150 B1 * 7/2011 Luu ......................... G06N 20/00
706/47
(Continued)

OTHER PUBLICATIONS

International Search Report and Written Opinion for International Application No. PCT/IL2019/050311, dated Jun. 7, 2019, 10 pgs.

*Primary Examiner* — Jeffrey P Aiello
(74) *Attorney, Agent, or Firm* — Kowert, Hood, Munyon, Rankin & Goetzel, P.C.; Jeffrey C. Hood; Luke S. Langsjoen

(57) ABSTRACT

A method of identifying defects in an electronic assembly, comprising, by a processing unit, obtaining a grid of nodes representative of a location of electronic units of an electronic assembly, wherein each node is neighboured by at most eight other nodes, wherein a first plurality of nodes represents failed electronic units according to at least one test criterion, and a second plurality of nodes represents passing electronic units according to the least one first test criterion, based on the grid, determining at least one first and second straight lines, and attempting to connect the first and second straight lines into a new line, wherein if at least one node from the new line belongs to the second plurality of nodes, concluding that an electronic unit represented by the node on the grid is a failed electronic unit, thereby facilitating identification of a failed electronic unit on the substrate.

20 Claims, 13 Drawing Sheets

Related U.S. Application Data

(60) Provisional application No. 62/646,596, filed on Mar. 22, 2018.

(51) Int. Cl.
*G01R 31/28* (2006.01)
*H01L 21/66* (2006.01)

(58) Field of Classification Search
CPC ..... H01L 22/14; H01L 22/20; H01L 2924/14; H01L 21/67253
USPC ............ 438/14, 18; 700/110, 121, 108, 109; 702/82, 117, 182, 188, 183, 59, 118, 181, 702/185, 35, 84, 81, 58; 714/25; 716/136
See application file for complete search history.

(56) References Cited

U.S. PATENT DOCUMENTS

| | | | |
|---|---|---|---|
| 2004/0036863 A1* | 2/2004 | Matsusita | G01N 21/956 257/E21.525 |
| 2013/0288403 A1* | 10/2013 | Chen | H01L 22/20 700/110 |

* cited by examiner

METHODS AND SYSTEMS FOR DETECTING DEFECTS ON AN ELECTRONIC ASSEMBLY

PRIORITY INFORMATION

This application is a continuation of U.S. application Ser. No. 16/981,951, entitled "Methods and Systems for Detecting Defects on an Electronic Assembly", filed Sep. 17, 2020, which is a 371 National Stage Entry of International Application No. PCT/IL2019/050311, entitled "Methods and Systems for Detecting Defects on an Electronic Assembly", filed Mar. 20, 2019, which claims the benefit of priority to U.S. Provisional Application No. 62/646,596, filed Mar. 22, 2018, which are hereby incorporated by reference in their entirety as though fully and completely set forth herein.

TECHNICAL FIELD

The presently disclosed subject matter relates to methods and systems for detecting defects on an electronic assembly.

BACKGROUND

Operation of electronic units such as semiconductor devices fabricated on electronic assemblies, such as semiconductor wafers, can be harmed by the presence of one or more scratches. A scratch can be created due to various reasons: erroneous manipulation of the wafer, shock with another device, defects in the manufacturing process, etc.

Many wafer manufacturers rely on the visual inspection of the wafer by an experienced expert in order to detect defects such as a scratch.

There is a need to improve the detection of defects on an electronic assembly.

GENERAL DESCRIPTION

In accordance with certain aspects of the presently disclosed subject matter, there is provided a method of identifying defects in an electronic assembly, comprising, by a processing unit, obtaining a grid of nodes representative of a location of electronic units of an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the least one test criterion; based on the grid, determining for at least one first node of the first plurality of nodes, at least one first straight line which is oriented along a direction on the grid out of four possible directions, includes the first node and nodes of at least the first plurality of nodes, and matches a first criterion; based on the grid, determining for at least one second node of the first plurality of nodes, at least one second straight line which is oriented along a direction on the grid out of four possible directions, includes the second node and nodes of at least the first plurality of nodes, and matches the first criterion, wherein if the first straight line and the second straight line match a second criterion, determining a third line which fits at least part of the first line and at least part of the second line according to a fitting criterion, thereby identifying, based on this third line, a subset of nodes, and wherein if at least one node from the subset of nodes belongs to the second plurality of nodes, concluding that an electronic unit represented by the at least one node on the grid is a failed electronic unit, thereby facilitating identification of a failed electronic unit of the electronic assembly.

In addition to the above features, the method according to this aspect of the presently disclosed subject matter can optionally comprise one or more of features (i) to (ix) below, in any technically possible combination or permutation:

i. a line can meet the first criterion only if data representative of a number of nodes included in the line and belonging to the first plurality of nodes is above a threshold;

ii. the first line and the second line match the second criterion if the first straight line and the second straight line are aligned, wherein the third line is a straight line joining or merging the first straight line and the second straight line, or the first straight line and the second straight line are located on the grid such that a circular line can fit at least part of the first straight line and at least part of the second straight line;

iii. a node meets the fitting criterion if the node is located on the third line, or the node is located at a distance of the third line which is below or equal to a half of a distance between two nodes of the grid;

iv. the method comprises determining a second subset of nodes set comprising one or more nodes which are located in the vicinity of the subset of nodes according to a proximity criterion; if at least one node belongs both to the second plurality of nodes and to the second subset of nodes, concluding that an electronic unit represented by the node on the grid is a failed unit;

v. the third line is a circular line, wherein determination of the third line comprises determining a lower limit $R_{min}$ and an upper limit $R_{max}$ for a possible radius of the third line, and determining the third line as a circular line which fits the first and second straight lines according to the fitting criterion and has a radius between $R_{min}$ and $R_{max}$;

vi. the method comprises determining a center C of the third line, the center corresponding to an intersection between a line orthogonal to the first straight line and crossing a point located in the middle of the first straight line, and a line orthogonal to the second straight line and crossing a point located in the middle of the second straight line, and determining the third line based on C, $R_{min}$ and $R_{max}$, such as it fits at least part of the first straight line and the second straight line according to the fitting criterion;

vii. the third line is a circular line, wherein the fitting criterion is relaxed for nodes of the second plurality of nodes which are located on an edge of the first straight line or of the second straight line with respect to other nodes of the first straight line or of the second straight line;

viii. the method comprises detecting whether a scratch is present on the electronic assembly based at least on the third line; and ix. the electronic assembly is an electronic substrate.

According to another aspect of the presently disclosed subject matter there is provided a method of identifying defects in an electronic assembly, comprising, by a processing unit, obtaining a grid of nodes representative of a location of electronic units on an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the at least one test criterion; based on the grid, determining for at least one first node of the first plurality of nodes, at least one first straight line which is oriented along a direction on the grid out of four possible directions, includes the first node and nodes of at least the first plurality of nodes, and matches a first criterion; if the first straight line, and a subset of nodes of the first plurality of nodes match a second criterion, determining a third line which fits at least part of the first line and at least part of the subset of nodes according to a fitting criterion, thereby identifying, based on this third line, a group of nodes, and wherein if at least one node from this group of nodes belongs to the second plurality of nodes, concluding that an electronic unit represented by the node on the grid is a failed electronic unit, thereby facilitating identification of a failed electronic unit of the electronic assembly.

In addition to the above features, the method according to this aspect of the presently disclosed subject matter can optionally comprise one or more of features (x) to (xviii) below, in any technically possible combination or permutation:

x. a line can meet the first criterion only if at least data representative of a number of nodes included in the line and belonging to the first plurality of nodes is above a threshold;

xi. the first line and the subset of nodes match the second criterion if the first straight line and the subset of nodes are aligned, and a distance between an extremity of the first straight line and the subset of nodes is below a threshold, wherein the third line is a straight line joining or merging the first straight line and the subset of nodes, or the first straight line and the subset of nodes are such that a circular line can fit at least part of the first straight line and at least pan of the subset of nodes;

xii. a node meets the fitting criterion if the node is located on the third line, or the node is located at a distance of the third line which is below or equal to a half of a distance between two nodes of the grid;

xiii. the method comprises determining a second subset of nodes set comprising one or more nodes which are located in the vicinity of the subset of nodes according to a proximity criterion; if at least one node belongs both to the second plurality of nodes and to the second subset of nodes, concluding that an electronic unit represented by the node on the grid is a failed unit.

xiv. the third line is a circular line, wherein determination of the third line comprises determining a lower limit $R_{min}$ and an upper limit $R_{max}$ for a possible radius of the third line, and determining the third line as a circular line which fits the first and second straight lines according to the fitting criterion and has a radius between $R_{min}$ and $R_{max}$;

xv. the method comprises determining a line L orthogonal to the first straight line and crossing a point located in the middle of the first straight line, wherein a center C of the third line is located on the line L, and determining the third line based on L, $R_{min}$ and $R_{max}$, such as it fits at least part of the first line and the subset of nodes according to the fitting criterion;

xvi. the third line is a circular line, wherein the fitting criterion is relaxed for nodes of the second plurality of nodes which are located on an edge of the first straight line with respect to other nodes of the first straight line;

xvii. the method comprises detecting whether a scratch is present on the electronic assembly based at least on the third line; and xviii. the electronic assembly is an electronic substrate.

According to another aspect of the presently disclosed subject matter there is provided a system for identifying defects in an electronic assembly, comprising a processing unit configured to obtain a grid of nodes representative of a location of electronic units of an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the least one test criterion, based on the grid, determine for at least one first node of the first plurality of nodes, at least one first straight line which is oriented along a direction on the grid out of four possible directions, includes the first node and nodes of at least the first plurality of nodes, and matches a first criterion; based on the grid, determine for at least one second node of the first plurality of nodes, at least one second straight line which is oriented along a direction on the grid out of four possible directions, includes the second node and nodes of at least the first plurality of nodes, and matches the first criterion, wherein if the first straight line and the second straight line match a second criterion, determine a third line which fits at least part of the first line and at least part of the second line according to a fitting criterion, thereby identifying, based on this third line, a subset of nodes, and wherein if at least one node from the subset of nodes belongs to the second plurality of nodes, conclude that an electronic unit represented by the at least one node on the grid is a failed electronic unit, thereby facilitating identification of a failed electronic unit of the electronic assembly.

In addition to the above features, the system according to this aspect of the presently disclosed subject matter can optionally comprise one or more of features (xix) to (xxvii) below, in any technically possible combination or permutation:

xix. a line can meet the first criterion only if data representative of a number of nodes included in the line and belonging to the first plurality of nodes is above a threshold;

xx. the first line and the second line match the second criterion if the first straight line and the second straight line are aligned, wherein the third line is a straight line joining or merging the first straight line and the second straight line, or the first straight line and the second straight line are located on the grid such that a circular line can fit at least part of the first straight line and at least part of the second straight line;

xxi. a node meets the fitting criterion if the node is located on the third line, or the node is located at a distance of the third line which is below or equal to a half of a distance between two nodes of the grid;

xxii. the system is configured to determine a second subset of nodes set comprising one or more nodes which are located in the vicinity of the subset of nodes according to a proximity criterion; if at least one node belongs both to the second plurality of nodes and to the second subset of nodes, conclude that an electronic unit represented by the node on the grid is a failed unit;

xxiii. the third line is a circular line, wherein determination of the third line comprises determining a lower limit $R_{min}$ and an upper limit $R_{max}$ for a possible radius of the third line, and determining the third line as a circular line which fits the first and second straight lines according to the fitting criterion and has a radius between $R_{min}$ and $R_{max}$;

xxiv. the system is configured to determine a center C of the third line, the center corresponding to an intersection between a line orthogonal to the first straight line and crossing a point located in the middle of the first straight line, and a line orthogonal to the second straight line and crossing a point located in the middle of the second straight line, and determine the third line based on C, $R_{min}$ and $R_{max}$, such as it fits at least part of the first straight line and the second straight line according to the fitting criterion;

xxv. the third line is a circular line, wherein the fitting criterion is relaxed for nodes of the second plurality of nodes which are located on an edge of the first straight line or of the second straight line with respect to other nodes of the first straight line or of the second straight line;

xxvi. the system is configured to detect whether a scratch is present on the electronic assembly based at least on the third line; and xxvii. the electronic assembly is an electronic substrate.

According to another aspect of the presently disclosed subject matter there is provided a system for identifying defects in an electronic assembly, comprising a processing unit configured to obtain a grid of nodes representative of a location of electronic units of an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the at least one test criterion; based on the grid, determine for at least one first node of the first plurality of nodes, at least one first straight line which is oriented along a direction on the grid out of four possible directions, includes the first node and nodes of at least the first plurality of nodes, and matches a first criterion, if the first straight line, and a subset of nodes of the first plurality of nodes match a second criterion, determine a third line which fits at least part of the first line and at least part of the subset of nodes according to a fitting criterion, thereby identifying, based on this third line, a group of nodes, and wherein if at least one node from the group of nodes belongs to the second plurality of nodes, conclude that an electronic unit represented by the at least one node on the grid is a failed electronic unit, thereby facilitating identification of a failed electronic unit of the electronic assembly.

In addition to the above features, the system according to this aspect of the presently disclosed subject matter can optionally comprise one or more of features (xxviii) to (xxxvi) below, in any technically possible combination or permutation:

xxviii. a line can meet the first criterion only if at least data representative of a number of nodes included in the line and belonging to the first plurality of nodes is above a threshold;

xxix. wherein the first line and the subset of nodes match the second criterion if the first straight line and the subset of nodes are aligned, and a distance between an extremity of the first straight line and the subset of nodes is below a threshold, wherein the third line is a straight line joining or merging the first straight line and the subset of nodes, or the first straight line and the subset of nodes are such that a circular line can fit at least part of the first straight line and at least part of the subset of nodes;

xxx. a node meets the fitting criterion if the node is located on the third line, or the node is located at a distance of the third line which is below or equal to a half of a distance between two nodes of the grid;

xxxi. the system is configured to determine a second subset of nodes set comprising one or more nodes which are located in the vicinity of the subset of nodes according to a proximity criterion; if at least one node belongs both to the second plurality of nodes and to the second subset of nodes, conclude that an electronic unit represented by the node on the grid is a failed unit;

xxxii. the third line is a circular line, wherein determination of the third line comprises determining a lower limit $R_{min}$ and an upper limit $R_{max}$ for a possible radius of the third line, and determining the third line as a circular line which fits the first and second straight lines according to the fitting criterion and has a radius between $R_{min}$ and $R_{max}$;

xxxiii. the system is configured to determine a line L orthogonal to the first straight line and crossing a point located in the middle of the first straight line, wherein a center C of the third line is located on the line L, and determine the third line based on L, $R_{min}$ and $R_{max}$, such as it fits at least part of the first line and the subset of nodes according to the fitting criterion;

xxxiv. the third line is a circular line, wherein the fitting criterion is relaxed for nodes of the second plurality of nodes which are located on an edge of the first straight line with respect to other nodes of the first straight line;

xxxv. the system is configured to detect whether a scratch is present on the electronic assembly based at least on the third line; and xxxvi. the electronic assembly is an electronic substrate.

According to another aspect of the presently disclosed subject matter there is provided a non-transitory storage device readable by a machine, tangibly embodying a program of instructions executable by the machine to perform a method of identifying defects in an electronic assembly, comprising obtaining a grid of nodes representative of a location of electronic units of an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the least one test criterion, based on the grid, determining for at least one first node of the first plurality of nodes, at least one first straight line which is oriented along a direction on the grid out of four possible directions, includes the first node and nodes of at least the first plurality of nodes, and matches a first criterion; based on the grid, determining for at least one second node of the first plurality of nodes, at least one second straight line which is oriented along a direction on the grid out of four possible directions, includes the second node and nodes of at least the first plurality of nodes, and matches the first criterion, wherein if the first straight line and the second straight line match a second criterion, determining a third line which fits at least part of the first line and at least part of the second line according to a fitting criterion, thereby identifying, based on this third line, a subset of nodes, and wherein if at least one node from the subset of nodes belongs to the second plurality of nodes, concluding that an electronic unit represented by the at least one node on the grid is a failed electronic unit, thereby facilitating identification of a failed electronic unit of the electronic assembly.

In addition to the above features, the method according to this aspect of the presently disclosed subject matter can optionally comprise one or more of features (i) to (ix) above, in any technically possible combination or permutation.

According to another aspect of the presently disclosed subject matter there is provided a non-transitory storage device readable by a machine, tangibly embodying a program of instructions executable by the machine to perform a method of identifying defects in an electronic assembly, comprising obtaining a grid of nodes representative of a location of electronic units of an electronic assembly, wherein each node is representative of an electronic unit and is neighboured by at most eight other nodes, wherein a first plurality of nodes represents failed electronic units according to at least one test criterion, and a second plurality of nodes represents passing electronic units according to the at least one test criterion; based on the grid, determining for at least one first node of the first plurality of nodes, at least one first straight line which is oriented along a direction on the grid out of four possible directions, includes the first node and nodes of at least the first plurality of nodes, and matches a first criterion; if the first straight line, and a subset of nodes of the first plurality of nodes match a second criterion, determining a third line which fits at least part of the first line and at least part of the subset of nodes according to a fitting criterion, thereby identifying, based on this third line, a group of nodes, and wherein if at least one node from this group of nodes belongs to the second plurality of nodes, concluding that an electronic unit represented by the at least one node on the grid is a failed electronic unit, thereby facilitating identification of a failed electronic unit of the electronic assembly.

In addition to the above features, the method according to this aspect of the presently disclosed subject matter can optionally comprise one or more of features (x) to (xviii) above, in any technically possible combination or permutation.

According to some embodiments, the proposed solution improves the reliability, accuracy and quality of the detection of defects on an electronic assembly.

According to some embodiments, the proposed solution improves the reliability, accuracy and quality of the detection of a scratch on an electronic assembly.

According to some embodiments, the proposed solution provides a possibility to detect patterns of defects present on an electronic assembly, although the number of possible patterns present on an image of the electronic assembly is huge and cannot be determined using available computers.

In particular, the proposed solution relies on an innovative modelling of the electronic assembly into a grid comprising a limited number of nodes, which therefore reduces computational complexity when attempting to detect patterns of defects. In addition, it relies, according to some embodiments, to the detection of a limited number of lines connecting the nodes, thereby reducing computational complexity when attempting to detect patterns of defects According to some embodiments, the proposed solution improves the ability to differentiate between a plurality of scratches.

According to some embodiments, the proposed solution improves the ability to differentiate between a plurality of scratches which are close one to the other.

According to some embodiments, the proposed solution improves the ability to differentiate between a plurality of scratches which intersect each other.

According to some embodiments, the proposed solution is able to detect a scratch even if it comprises a succession of faulty electronic units which are "broken" by the presence of operational electronic units.

According to some embodiments, the proposed solution is able to detect a scratch which can have different patterns.

According to some embodiments, the proposed solution differentiates between defects which are representative of a scratch, and defects which are caused by other sources of defects.

According to some embodiments, the proposed solution improves characterization of the shape of the scratch.

According to some embodiments, the proposed solution is able to identify electronic units that may be affected by a scratch but have not been previously identified or marked as faulty.

According to some embodiments, the proposed solution can be applied to electronic assemblies of different types and/or sizes.

According to some embodiments, the proposed solution proposes an automated method.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods have not been described in detail so as not to obscure the presently disclosed subject matter.

Unless specifically stated otherwise, as apparent from the following discussions, it is appreciated that throughout the specification discussions utilizing terms such as "obtaining", "determining", "providing", "connecting", "detecting", "assigning", "dividing", "updating", "fitting" or the like, refer to the action(s) and/or process(es) of a processing unit that manipulates and/or transforms data into other data, the data represented as physical, such as electronic, quantities and/or the data representing the physical objects.

The term "processing unit" covers any computing unit or electronic unit with data processing circuitry that may perform tasks based on instructions stored in a memory, such as a computer, a server, a chip, a processor, a hardware processor, etc. It encompasses a single processor or multiple processors, which may be located in the same geographical zone or may, at least partially, be located in different zones and may be able to communicate together.

The term "memory" as used herein should be expansively construed to cover any volatile or non-volatile computer memory suitable to the presently disclosed subject matter.

Embodiments of the presently disclosed subject matter are not described with reference to any particular programming language. It will be appreciated that a variety of programming languages may be used to implement the teachings of the presently disclosed subject matter as described herein.

The invention contemplates a computer program being readable by a computer for executing one or more methods of the invention. The invention further contemplates a machine-readable memory tangibly embodying a program of instructions executable by the machine for executing one or more methods of the invention.

Figure 1:
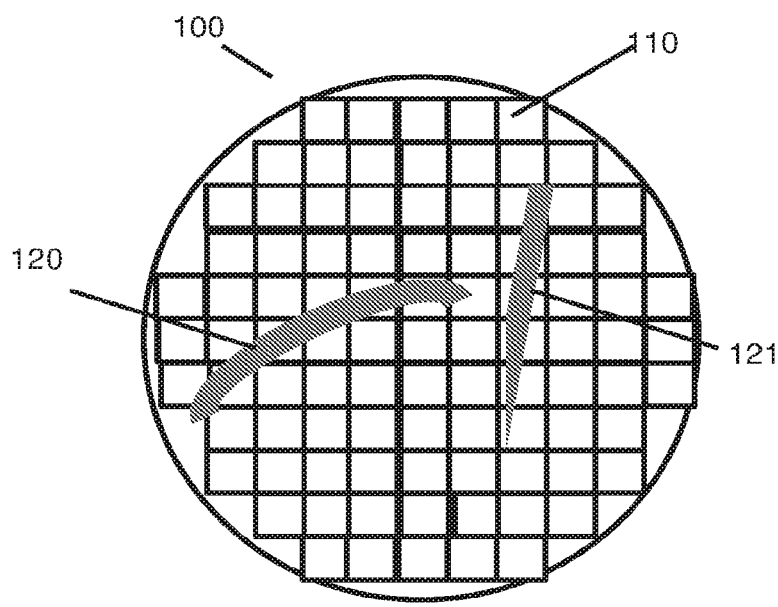
FIG. 1 illustrates an embodiment of an electronic assembly.

FIG. 1 illustrates an embodiment of an electronic assembly 100.

The electronic assembly 100 can comprise a plurality of electronic units 110.

According to some embodiments, the electronic assembly 100 can be an electronic substrate.

This electronic assembly 100 can comprise e.g. a wafer, a glass plate, a roll, a tape or any other substrate on which and/or in which a plurality of electronic units are fabricated, etc.

The electronic units 110 can comprise e.g. integrated circuits, transistors, microprocessors, memories, displays. MEMS, solar cells, battery cells, any types of electronic devices or systems, etc.

In the example of FIG. 1, the shape of the electronic assembly 100 is approximately circular, but this is not mandatory, and other shapes can be used.

In the example of FIG. 1, two scratches 120, 121 are depicted, in a schematic way.

Figure 3:
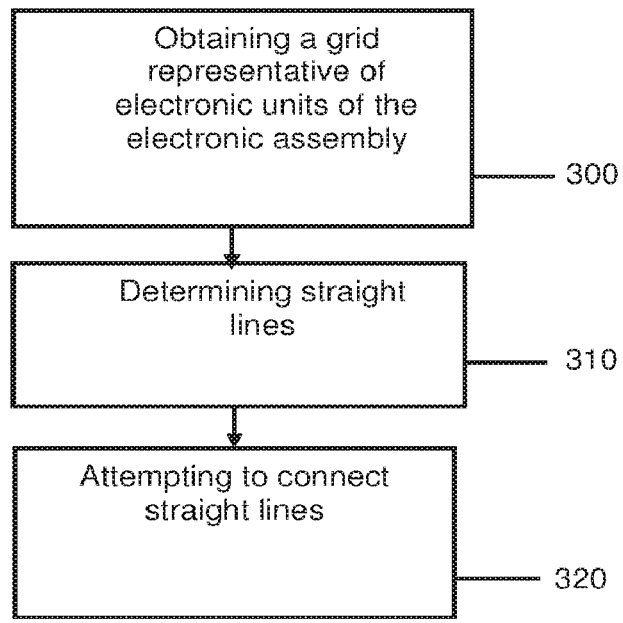
FIG. 3 illustrates an embodiment of a method of building lines on a grid representative of an electronic assembly.

Attention is now drawn to FIG. 3, which depicts an embodiment of a method of detecting at least one failed/faulty electronic unit.

Figure 2:
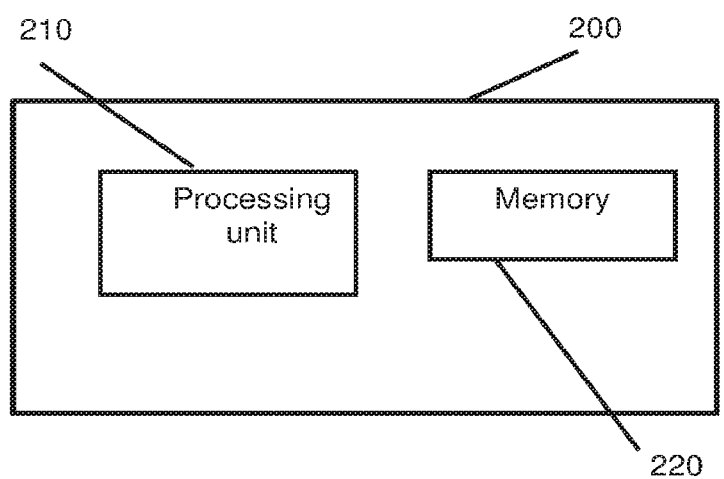
FIG. 2 illustrates a system that can be used for performing various methods described hereinafter.

The method can be performed e.g. by a system 200 depicted in FIG. 2. The system 200 can comprise a processing unit 210 and a memory 220. The memory 220 can store instructions which cause the processing unit to perform e.g. the method of FIG. 3, or other methods described hereinafter.

In some embodiments, system 200 comprises an interface which can allow an operator to enter data, and a screen to output data to the operator.

System 200 can typically exchange data with other devices, through any adapted wired/unwired communication network.

The method can comprise (see operation 300) obtaining a grid of nodes representative of a location of electronic units of the electronic assembly 100.

According to some embodiments, the grid comprises equidistant nodes (that is to say that two adjacent nodes are separated by the same distance along a horizontal or vertical direction on the grid).

Each node can be characterized by its position on the grid.

According to some embodiments, the grid can be a Wafer Bin Map (WBM).

For a given electronic unit, data representative of this given electronic unit can be stored and associated to the node representative of this given electronic unit.

According to some embodiments, the grid is particular in the sense that each node is neighboured by, at most, eight other nodes. Therefore, each given node has, at most, eight neighbouring nodes. For a given node, neighbouring nodes are the nodes which are in contact with this given node, or which are the closest to the given node according to some proximity criterion. The proximity criterion can be defined e.g. as follows: adjacent nodes of a given node are nodes which are separated from this given node (either in the horizontal, vertical or diagonal direction) by less than one node.

According to some embodiments, when the electronic units are not rectangular, then each node may be neighboured by a (finite) number of other nodes that is different from eight. In some embodiments, this number can be less than eight, and in other embodiments, this number can be more than eight.

The different parameters of the map (number of nodes, position of the nodes, data associated to the nodes, etc.) can be stored e.g. in a memory.

Data representative of electronic units of the electronic assembly can typically comprise test data which can be performed on the electronic units. Several tests can be performed such as electronic tests, mechanical tests, stress tests, electromagnetic tests, etc.

These tests can be performed e.g. by a tester which can be connected through a direct or indirect connection, to the electronic units.

Therefore, test data can comprise physical data which were measured during the tests, such as temperature, pressure, current, voltage, etc. This list is not limitative.

According to some embodiments, data representative of electronic units can include e.g. a value indicative of the results of the test, such as "passed" (corresponding to an electronic unit which passed the test and is thus considered as operational), "failed" (corresponding to an electronic unit which failed the test(s) and is thus considered as faulty), "unknown" (if no data and/or insufficient data were obtained during the test).

According to some embodiments, data representative of electronic units can be represented by a colour ("heat map"—this is however not limitative). The intensity and/or nature of the colour can represent whether the electronic units passed or failed the tests.

According to some embodiments, data representative of each of the electronic units of a first plurality of electronic units does not match a test criterion. This can indicate that the first plurality of electronic units failed to pass one or more tests, since the data measured during these tests for these electronic units are not compliant with the test criterion. Therefore, for a given electronic unit of the first plurality of electronic units, data associated to a node representative of this given electronic unit can comprise data which represents this status (such as "failed", which can be encoded e.g. by a binary value 0). The electronic units of this first plurality of electronic units are faulty, and there is some likelihood that their defect is due to a scratch which may be detected later on. The grid therefore comprises a first plurality of nodes which each represent an electronic unit of this first plurality of failed electronic units.

According to some embodiments, for a given electronic unit of the first subset, data associated to a node representative of this given electronic unit can comprise data which represents the level of performance in the test. In this case, if a first electronic unit of the first subset failed the test with a difference X from the threshold of the test criterion, and a second electronic unit of the first subset failed the test with a difference Y from the threshold of the test criterion, wherein Y>X, data associated with the nodes of the first and second electronic units can represent the fact that both electronic units failed the test and the corresponding values X and Y, which reflect the level of performance of the electronic units in the test.

According to some embodiments, data representative of a second plurality of the electronic units matches a test criterion. This test criterion is generally the same for assessing "failed" electronic units and "passing" electronic units.

In this case, as mentioned above, nodes representative of the electronic units of the second plurality of electronics units can be associated with data which reflects the fact that the corresponding electronic units passed the test (such as "passed", which can be encoded e.g. with a binary value 1—this is however not limitative).

The grid therefore comprises a second plurality of nodes which each represent an electronic unit of this second plurality of electronic units.

Figure 4:
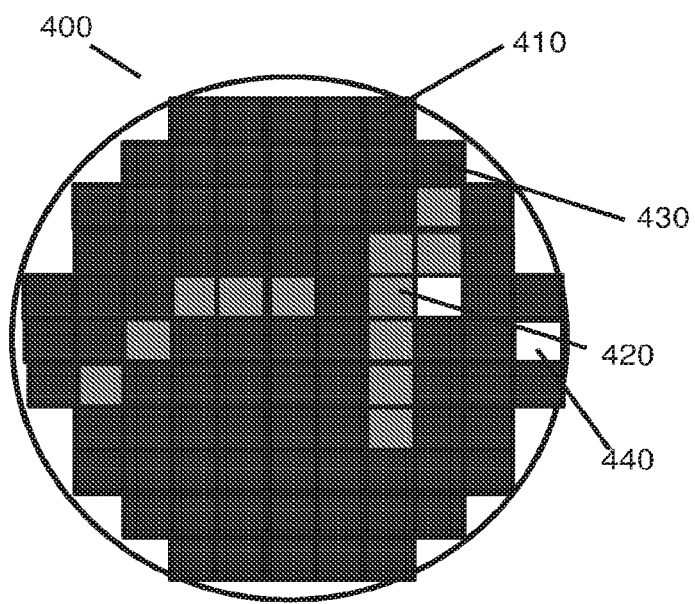
FIG. 4 illustrates a grid, comprising nodes representative of electronic units, wherein some of the electronic units are associated with data which meet a test criterion, and some of the electronic units are associated with data which do not meet the test criterion.

A non-limitative example of a map 400 is represented in FIG. 4. As shown, each electronic unit is represented by a node 410. In this particular example, each node is a square, but this is not mandatory and is merely for illustration (a node can also be represented by a single point).

Nodes 420 are representative of electronic units which failed to pass one or more tests according to a test criterion. This is represented in the example of FIG. 4 by grey colour.

Nodes 430 are representative of electronic units which passed one or more tests according to a test criterion. This is represented in the example of FIG. 4 by black colour.

Nodes 440 are representative of electronic units for which insufficient data were obtained concerning the tests, and therefore could not be assigned to electronic units which passed or failed the tests. This is represented in the example of FIG. 4 by white colour.

Figure 3A:
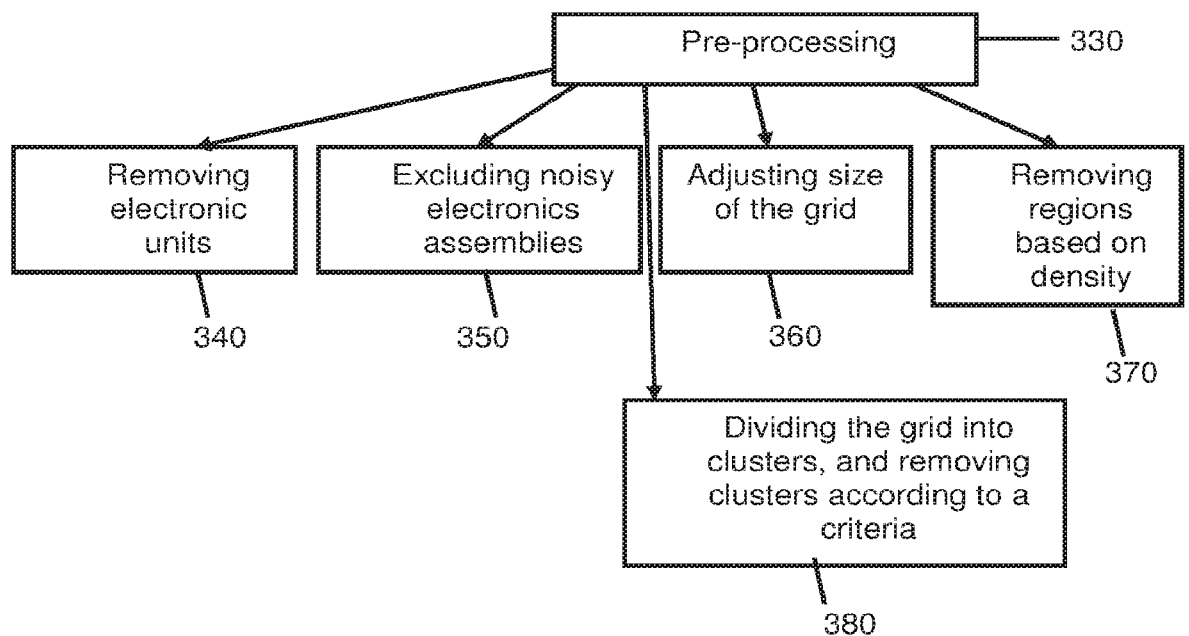
FIG. 3A illustrates various pre-processing operations that can be performed to improve detection of faulty units and/or scratches.

As explained with reference to FIG. 3A, according to some embodiments, some pre-processing 330 of the grid can be performed in order to improve detection of failed electronic units, and/or of a scratch. This pre-processing is however not mandatory.

The various operations described in pre-processing 330 can be performed in any suitable order. In some embodiments, only some of the operations are performed.

According to some embodiments, the grid can be pre-filtered using e.g. dilatation and/or erosion algorithms.

According to some embodiments, the method can comprise removing 340 from the grid (or disregarding in the next steps of the method) nodes which are associated with electronic units of the first plurality of electronic units, based on information that their belonging to the first plurality of electronic units is not due to the presence of a scratch. This information can be stored e.g. in a memory.

This information can comprise e.g. an input of an operator who indicates that these electronic units are faulty not because of the presence of a scratch.

According to some embodiments, this information can comprise heuristics which indicate that the position of the electronic units causes their belonging to the first plurality of electronic units. For example, the geographical position of the electronic unit on the electronic assembly (and therefore on the grid) can cause the electronic unit to be faulty.

A possible example can include excluding (e.g. all) electronic units (or nodes representative thereof) present on the edge of the electronic assembly because their position is the main source of their defects, and not the presence of a scratch.

The list of electronic units, or nodes representative thereof, which were excluded from the grid (or which will be ignored in the next steps of the method) can be stored e.g. in a memory, such as memory 220.

According to some embodiments, pre-processing 330 can include operation 350 which comprises, for a given electronic assembly, obtaining data D representative of a number of electronic units which belong to the first plurality of electronic units (faulty electronic units). This data can be stored in the form of an absolute number, or in the form of a percentage (e.g. percentage of faulty electronic units over the total number of electronic units), or in any other relevant form.

If operation 350 is performed after operation 340, this data does not include electronic units which were removed from the grid at operation 340.

If this data D is above a threshold, the method can comprise disregarding this given electronic assembly for detection of faulty electronic units and/or for scratch detection. Indeed, an electronic assembly which comprises a large number and/or large percentage of faulty electronic units increases the risk of false positive scratch detection and thus false positive detection of faulty electronic units.

Values of the threshold can be stored in a memory and can be predefined or set by an operator.

Pre-processing 330 can comprise operation 360 in which the size of the grid is adjusted. In particular, since electronic assemblies can have different sizes, a ratio between the width (X axis) and height (Y axis) can be defined. If the grid does not comply with this ratio, width and/or height of the grid can be adjusted so as to comply with the ratio.

According to some embodiments, pre-processing 330 can comprise operation 370 in which a density $D_R$ of nodes representative of electronic units of the first plurality of electronic units is computed for various regions of the map. This density reflects e.g. the proportion of faulty electronic units in each region.

According to some embodiments, three categories of regions can be identified: regions with a high density $D_R$, regions with a medium density $D_R$, and regions with a low density $D_R$. The threshold can be set to define which density corresponds to high, medium or low density. A possible non-limitative example is that density above 0.33 is considered as high, density below 0.066 is considered as low, and density between 0.066 and 0.33 is considered as medium.

According to some embodiments, electronic units of the first subset whose nodes are present in the high density and low density regions are removed from the grid or ignored in the detection method. This is however not mandatory.

According to some embodiments, pre-processing 330 can comprise operation 380, in which the grid is divided into clusters.

A cluster can be defined as a group of nodes, which comprises nodes representative of electronic units of the first plurality of electronic units which have a distance one from to another less than a proximity criterion P.

Operation 380 can thus comprise dividing the nodes of the map into a plurality of clusters C, wherein each cluster C comprises $N_C$ adjacent nodes representative of electronic units of the first subset (adjacent nodes are nodes which meet the proximity criterion).

The proximity criterion can be defined e.g. as an absolute distance and/or as a number of nodes.

A given cluster can be defined e.g. as a 2D shape (e.g. square or rectangle) which is the smallest 2D shape which covers all nodes representative of electronic units of the first plurality of electronic units which meet the proximity criterion. Depending on the proximity criterion, the cluster can also comprise nodes representative of electronic units of the second plurality of electronic units (see clusters 395, 396 in the example of FIG. 3B, which comprises both electronic units of the first and second plurality of electronic units).

Figure 3B:
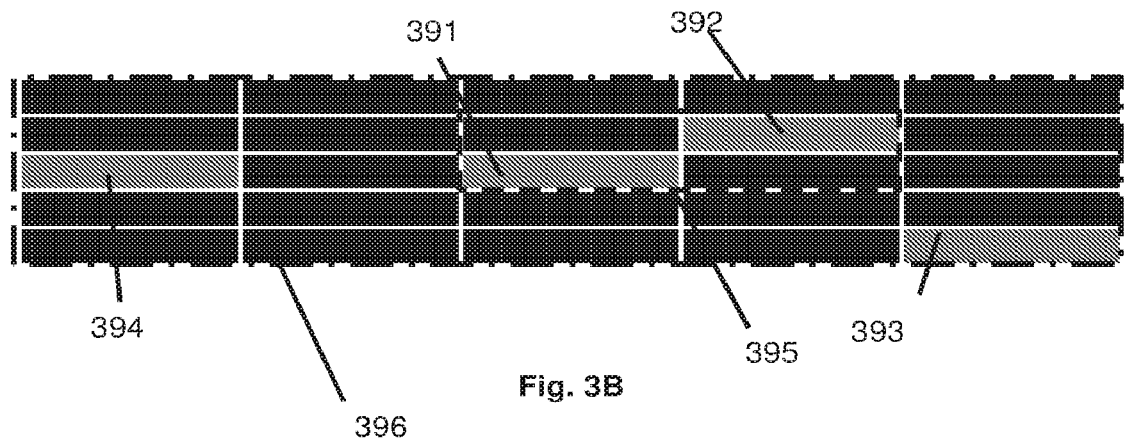
FIG. 3B illustrates an example of a division of a grid, comprising nodes representative of electronic units, into clusters.

A non-limitative example of a division of the nodes into clusters is provided in FIG. 3B.

Nodes 391, 392, 393 and 394 belong to the first plurality of nodes (nodes representative of faulty electronic units), and the other nodes to the second plurality of nodes (nodes representative of operational electronic units).

Assume the proximity criterion is defined as one node.

In the present example, only nodes 391 and 392 are assigned to a cluster (these two nodes are separated by a distance which is less than one node).

In this example, the cluster can be defined e.g. as shape 395 which includes nodes 391, 392 and also nodes representative of operational electronic units (second plurality of nodes).

Assume the proximity criterion is now defined as two nodes.

In this case, nodes 391, 392, 393 and 394 are assigned to the same cluster. This cluster can be defined e.g. as shape 396 which encompasses all nodes 391, 392, 393 and 394 and also nodes of the second plurality of nodes.

According to some embodiments, each cluster C is defined by at least one dimension $L_C$ (such as the width and/or the height of the cluster).

According to some embodiments, if $L_C$ is above a threshold (e.g. the height is above a threshold, and/or the width is above a threshold), the method can comprise removing cluster C from the grid, and/or ignoring cluster C in the further steps of the scratch detection method.

Indeed, a cluster of large dimensions is probably not representative of a scratch, but of other sources of defects in the electronic units themselves.

According to some embodiments, if $N_C$ is above a threshold, the method can comprise removing cluster C from the grid, and/or ignoring cluster C in the further steps of the scratch detection.

Indeed, a cluster with a high number (relative number, or absolute number) of faulty electronic units is probably not representative of a scratch, but of other sources of defects in the electronic units themselves.

According to some embodiments, other criterion can be used, such as data representative of a ratio between $N_C$ and $L_C$, etc., in order to determine whether cluster C should be kept in the scratch detection analysis, or should be removed/ignored.

Reverting to the method of FIG. 3, once the grid has been obtained, the method can comprise (operation 310) determining straight lines which connect nodes representative of electronic units of the first plurality of electronic units (which failed the tests according to the test criterion).

"Straight" lines refers to lines which join nodes (these lines can join e.g. a central point of the nodes, or the node themselves if these nodes are discrete points) and which air straight, as opposed to circular lines which comprise a curvature.

According to some embodiments, since each node comprises at maximum eight neighbouring nodes, for a given node, at maximum four possible different straight lines can go through this given node (horizontal line, vertical line, and two diagonal lines). These four possible different straight lines have different slopes (see lines 510, 511, 512 and 513 in FIG. 5).

Figure 5:
FIG. 5 illustrates a method of determining straight lines which pass through at least some nodes representative of electronic units associated with data which do not meet test criterion.

An example is provided with reference to FIG. 5.

Assume operation 310 aims at this stage to determine straight lines which pass through node 500 which belongs to the first plurality of nodes (representative of faulty electronic units).

Definition of a straight line can be determined according to various criterion.

According to some embodiments, the length of the straight lines can be defined to meet one or more thresholds (criterion 1). In particular, the length of the straight line can be defined between a minimal length and a maximal length.

The length of the straight line can be defined by a number of nodes which are present on this straight line. It can be defined that a straight line is determined only if it comprises a minimal number $N_1$ of nodes and/or a maximal number $N_2$ of nodes.

According to some embodiments, a straight line is determined if the number of nodes representative of electronic units of the first plurality of electronic units (faulty electronic units) present on this straight line meets a threshold $T_1$ (criterion 2).

For example, if $N_1=N_2=11$, and $T_1=6$, then only line 510 is determined as a straight line at operation 310.

If $N_1=N_2=11$, and $T_1=5$, then line 511 is also determined as a straight line.

According to some embodiments, a straight line is determined if:
  the number of nodes representative of electronic units of the first subset present on this straight line meets a threshold $T_1$ (criterion 2 mentioned above), and
  on this line, each node of the first plurality of nodes is separated by the next node of the first plurality of nodes by a distance below a threshold $T_2$, or by a number of nodes of the second plurality of nodes which are below a threshold $T'_2$ (criterion 3).

For example, it can be defined that $T'_2=1$. Therefore, in the example of FIG. 5, nodes 501 and 502 meet this condition, whereas nodes 503 and 504 do not meet this condition (since they are separated by two nodes of the second plurality of nodes).

Any combination of criterion 1, 2 and 3 can be defined to select a straight line. The assignment of nodes to a given line can be stored e.g. in a memory, such as memory 220, in which each node can be associated with at least the following data:

position of the node;
first plurality of nodes, or second plurality of nodes;
assignment to a straight line;
assignment to a curved line (see hereinafter); and
various other data.

As mentioned, operation 310 can be applied to each node of the map. In other words, for each node of the map (or for each node of a given cluster), between 0 and 4 straight lines are determined which meet one or more criterion as defined above, and which pass through this node. All the criterion mentioned above can be stored in a memory, e.g. memory 220.

According to some embodiments, operation 310 can be applied to each node of the grid which belongs to the first plurality of nodes (faulty electronic units).

At the output of operation 310, a plurality of straight lines can be determined.

Of course, at least some of the straight lines which are determined at operation 310 can be redundant and therefore can be connected or merged, as explained hereinafter. Reverting to the method of FIG. 3, the method can further comprise attempting to connect straight lines (operation 320).

Figure 3C:
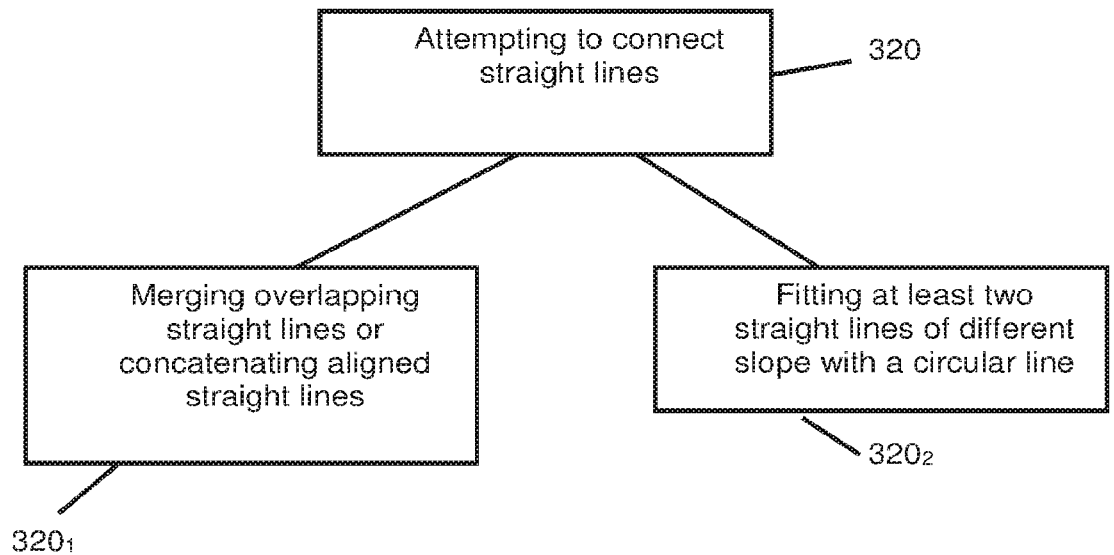
FIG. 3C illustrates possible operations that can be performed to connect two different straight lines.

Operation 320 can comprise concatenating (e.g. connecting or fusing) at least some of the straight lines which are located on the same direction (see operation $320_1$ in FIG. 3C. This concatenation can be registered by changing data associated with each node and which reflects the line to which this node is associated. A given node which was previously associated with a given line can be associated with the concatenated line.

Various connection/fusing operations can be performed, as exemplified below.

According to some embodiments, operation $320_1$ can comprise, for at least two straight lines $L_1$, $L_2$, which are located on the same direction, and which share at least one common node (that is to say that the common node belongs to both $L_1$ and $L_2$), fusing/merging these two straight lines into a new straight line (e.g. called $L_3$) which is longer and covers both $L_1$ and $L_2$.

This can be applied to more than two lines, if for example a common node belongs to more than two lines located on the same direction.

The concatenated straight line can be built by creating a straight line which covers all the lines to be fused.

This concatenation can be repeated several times, that is to say that at least two lines can be concatenated, and then concatenated with one or more other straight lines, etc. Node which are crossed by the concatenated line can be associated with this concatenated line.

Figure 6:
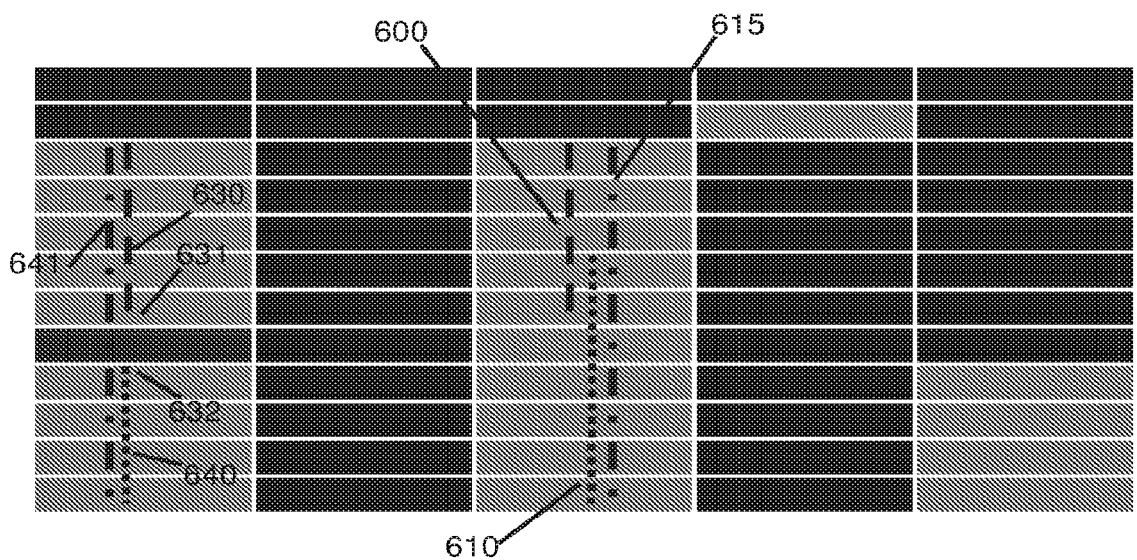
FIG. 6 illustrates a method of concatenating straight lines.

A non-limiting example is provided in FIG. 6 in which lines 600 and 610 share two common nodes and will be fused into a new longer line 615.

According to some embodiments, operation $320_1$ can comprise, for at least two straight lines $L_1$, $L_2$ which are aligned (but the lines are not overlapping) and for which a node $N_1$ located at an extremity of line $L_1$ is adjacent (according to a proximity criterion $T_3$) to another node $N_2$ located at an extremity of line $L_2$, connecting these two straight lines in order to obtain a new straight line (e.g. called $L_3$) which is longer and covers both $L_1$ and $L_2$.

The proximity criterion $T_3$ can be defined e.g. as a maximal number of nodes, or as a maximal number of nodes belonging to the first plurality of nodes (faulty electronic units), which separate node $N_1$ and node $N_2$. If this proximity criterion is met for nodes $N_1$ and $N_2$, then lines $L_1$ and $L_2$ can be merged into a single line $L_3$.

If the extremity of a first straight line $L_1$ and the extremity of a second straight line $L_2$ are not adjacent, but separated by one or more intermediate nodes whose number meets the proximity criterion, then a connection is "drawn" between $L_1$ and $L_2$ which covers both the nodes of L1, of L2 and these intermediate nodes.

A simple example is depicted in FIG. 6.

In this example, straight lines 630 and 640 have been determined independently. Since an extremity 631 of straight line 630 is adjacent to an extremity 632 of straight line 640 (the proximity criterion is in this example one node), straight lines 630 and 640 can be concatenated into a single straight line 641.

Attention is now drawn to operation $320_2$ of FIG. 3C.

Operation $320_2$ can comprise, for at least some of the straight lines which are not located on the same direction (different slope), determining one or more curved lines which fit, at least partially, the straight lines (and/or the nodes belonging to these straight lines) according to a fitting criterion. The fitting criterion can be predefined and/or set by an operator. The straight lines can be e.g. straight lines determined at operation 310, and/or straight lines which result from the concatenation of a plurality of straight lines (operation 320).

Assume a first straight line $L_1$ has been determined, and a second straight line $L_2$ has been determined, wherein $L_1$ and $L_2$ have different directions (different slopes). In particular, operation $320_2$ can be applied to at least two lines comprising one diagonal line, and one line which is not diagonal (such as a horizontal or vertical line).

According to some embodiments, it is attempted to fit the first straight line $L_1$ and the second straight line $L_2$ with a circular line only if they meet a proximity criterion $T'_4$.

The proximity criterion $T'_4$ can be defined e.g. as a maximal number of nodes, or as a maximal number of nodes belonging to the first plurality of nodes (faulty electronic units), which separate an extremity of line $L_1$ and an extremity of line $L_2$. If this proximity criterion is met, then it can be attempted to fit lines $L_1$ and $L_2$ with a circular line.

Figure 7:
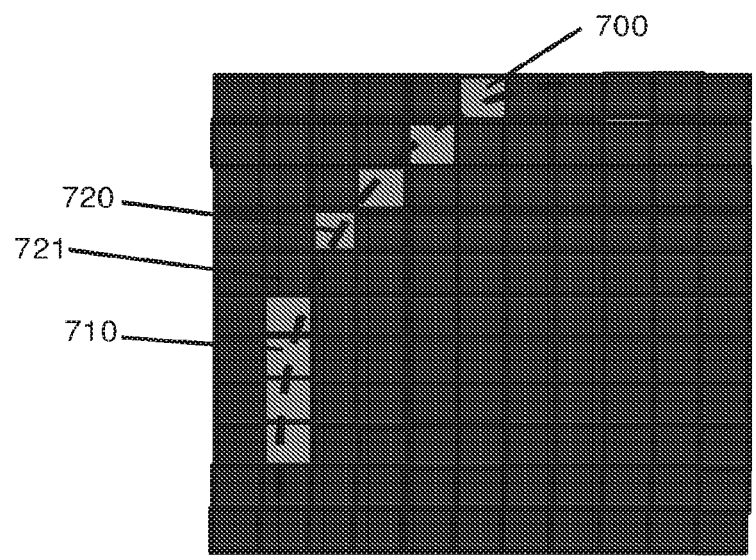
FIG. 7 illustrates a method of determining one or more circular lines which fit two straight lines which are not aligned.

An example is illustrated in FIG. 7.

Straight line 700 (diagonal line) and straight line 710 (vertical line) may not be merged into a single straight line since they have different directions. Straight line 700 and straight line 710 meet a proximity criterion and it can thus be attempted to fit a circular line to these two lines.

The method can comprise attempting to find a circular line, such as a portion of an arc of a circle, which fits the nodes of straight line 700 and the nodes of straight line 710 according to a fitting criterion. Such fitting can be made with respect to the nodes belonging to these straight lines, and/or with respect to the straight lines themselves.

In particular, the fitting criterion can define data representative of the maximal acceptable error between the position of the curved line (equation of the curved line) and the position of the nodes. Position of each node can be defined e.g. as:
- the center of this node, or
- some predefined point present in this node (for instance when the node is defined as a 2D surface, a predefined point can be defined within this 2D surface), or
- if this node is defined as a single point, as the position of this single point.

This error can be defined e.g. as the maximal (accumulated/total) distance between the circular line and the nodes.

In some embodiments, if it is attempted to determine a circular line (third line) which fits a first straight line and a second straight line, it may occur that the circular line does not fit one or more given nodes among the nodes of the first straight line and of the second straight line (that is to say that the circular line does not intersect at all this given node), and/or one or more given nodes located between the first and second straight lines.

According to some embodiments, the fitting criterion can dictate that all nodes located at a distance of the third line which is e.g. below or equal to half a distance between two nodes of the grid, can be considered as associated with the third line (although these nodes are not located exactly on the third line).

The nodes associated with the third line can be nodes of the first and second straight lines, but also other nodes which are located between the two straight lines, or in the vicinity of the two straight lines, and for which a fitting with the third circular line meets the fitting criterion.

According to some embodiments, a circular line is considered as fitting two straight lines according to the fitting criterion if a proportion of nodes of the first and second lines which are fit by the third line (according to the maximal distance set in the fitting criterion) is above a threshold (thereby indicating that the fitting is successful).

In the example of FIG. 7, an arc 720 has been found which fits lines 700 and 710. As shown, the arc 720 does not necessarily cross each node of lines 700 and 710 (or the center of each node if a node is defined as a 2D surface).

Once a node is identified as belonging to the third line (circular line), corresponding data can be stored. If the node previously belonged to a straight line, it can be stored that it is now associated with a circular line. If the node did not belong to any line, it can be stored that it is now associated with a circular line.

A plurality of curved lines can be determined.

Figure 7A:
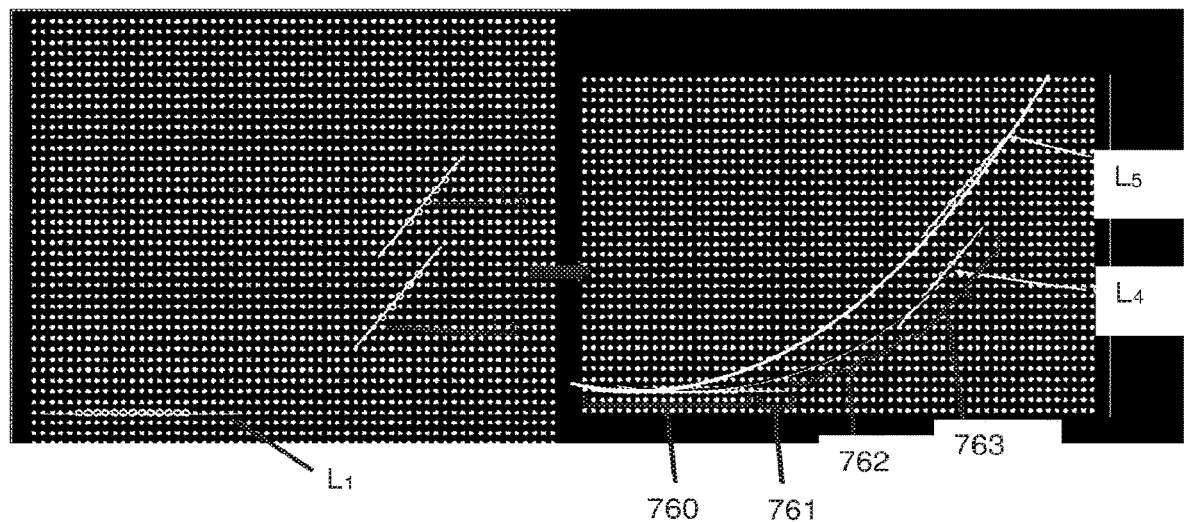
FIG. 7A illustrates an example in which it is attempted to fit the best circular line between two different pairs of straight lines.

Another example of fitting two straight lines with a circular line is provided in FIG. 7A. A horizontal straight line $L_1$ and two diagonal lines $L_2$, $L_3$ are depicted. A circular line $L_4$ which fits straight lines $L_1$ and $L_2$ meets the fitting criterion. However, a curved line $L_5$ which fits straight lines $L_1$ and $L_3$ does not meet the fitting criterion (because a number of nodes of line $L_1$ which are not associated with line $L_3$ is too high).

As shown, although $L_4$ meets the fitting criterion, line $L_4$ does not intersect all nodes of straight lines $L_1$ and $L_2$.

Nodes which belong to portion 760 of line $L_1$ are located at a distance of line $L_4$ which is below half a distance between two nodes of the grid, and therefore are associated with line $L_4$.

Nodes which belong to portion 761 of line $L_1$ are located at a distance of line $L_4$ which is above half a distance between two nodes of the grid, and therefore are not associated with line $L_4$.

Concerning portion 762 (nodes which are not part of the original straight lines on which the fitting is performed), if a node is located at a distance of line $L_4$ which is below half a distance between two nodes of the grid, it is associated with line $L_4$, and if this condition is not met, it is not associated with line $L_4$.

Concerning nodes of line $L_2$ (portion 763), most nodes are located at a distance of line $L_4$ which is below half a distance between two nodes of the grid.

Although in the example of FIGS. 7 and 7A, a circular line is built based only on two straight lines of different direction, it has to be noted that a circular line can be built based on more than two straight lines.

According to some embodiments, if the pair of lines can be seen as adjacent sides of a regular octagon, then it is attempted to fit these pairs of lines (or the nodes belonging to these lines) with a circular line.

Figure 8:
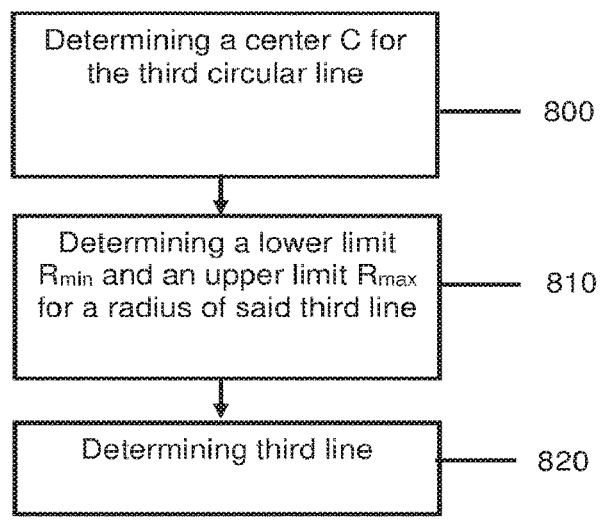
FIG. 8 illustrates a method of determining a circular line which fits two straight lines.

Attention is drawn to FIG. 8 which depicts a method of fitting two straight lines with a circular line. This method is not limitative and other techniques can be used.

The method can comprise determining (operation 800) a center C for the third circular line. This center C can be determined e.g. as an intersection between:
- a line orthogonal to the first straight line and crossing a point located in the middle of the first straight line, and
- a line orthogonal to the second straight line and crossing a point located in the middle of the second straight line.

Figure 8A:
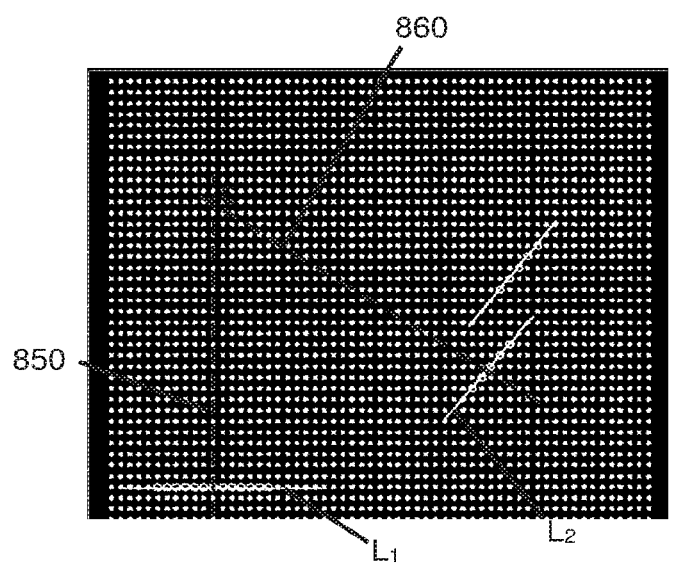
FIG. 8A illustrates an operation of the method of FIG. 8.

This is shown in FIG. 8A, in which center C is determined as the intersection of lines 850 and 860.

The method can comprise determining (operation 810) a lower limit $R_{min}$ and an upper limit $R_{max}$ for a radius of the third line.

Assume that the fitting criterion requires that the circular line is considered as fitting a node if the distance between the circular line and the node is below to or equal to D (for example D is equal to half a distance between two nodes of the grid).

A first circular line is built such that:
- the circular line has center C, and
- the circular line has the maximal radius among all possible circular lines for which distance D is still met for nodes (all nodes, or in some embodiments, at least some of the nodes) of the first straight line.

$R_{max}$ is set equal to radius of the first circular line.

A second circular line is built such that:
- the circular line has center C, and
- the circular line has the minimum radius among all possible circles for which distance D is still met for nodes (all nodes, or in some embodiments, at least some of the nodes) of the first straight line.

$R_{min}$ is set equal to radius of the second circular line.

In other words, the "extreme" circular lines are built, thereby limiting the number of possible circular lines that need to be tested afterwards to identify the best circular line.

Based on C, $R_{min}$ and $R_{max}$, a plurality of circular lines is tested until a circular line which fits best the two straight lines is obtained (operation 820).

According to some embodiments, it is attempted to fit these pairs of lines (or the nodes belonging to these lines) with an arc of a circle using RANSAC with the Levenberg-Marquardt algorithm to find the best fitting arc of a circle.

If no possible circular line can be found, then the method is aborted. The method can then comprise attempting to fit one of the two lines with another adjacent line, using a straight line (see operation $320_1$) or a circular line (see operation $320_2$). If it is not possible, the method can move to another line in order to attempt to fit it with another adjacent line. The method can be repeated until all lines have been processed.

Figure 9:
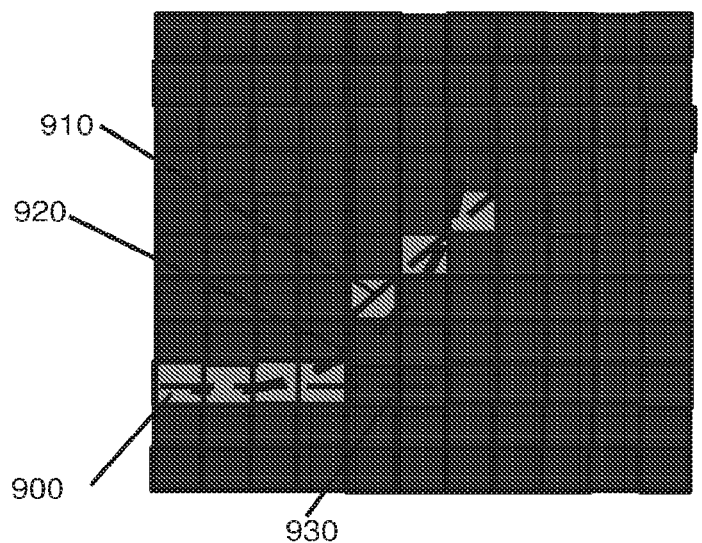
FIG. 9 illustrates, on a non-limitative example, a method of fitting two straight lines using a circular line, wherein the fitting criterion is relaxed for nodes located on the edge and which correspond to non-faulty electronic units.

Attention is drawn to FIG. 9.

According to some embodiments, assume a circular line has to be determined which fits first straight line 900 and second straight line 910.

If first straight line 900 (and/or second straight line 910) comprises, on one of its edges, one or more nodes which belong to the second plurality of nodes (passing electronic units), then the fitting criterion can be relaxed for these nodes.

In other words, a larger error between the third line and these side passing nodes is accepted, relative to the other nodes.

A non-limiting example is illustrated in FIG. 9.

As shown, the third circular line 920 fits well a portion of the first straight line 900 comprising failing electronic units. The fitting with side nodes 930 of the first straight line 900 representative of passing electronic units is worse, but since the fitting criterion has been relaxed for these nodes, the third circular line 920 is still considered as matching the fitting criterion for fitting lines 900 and 910.

Figure 10:
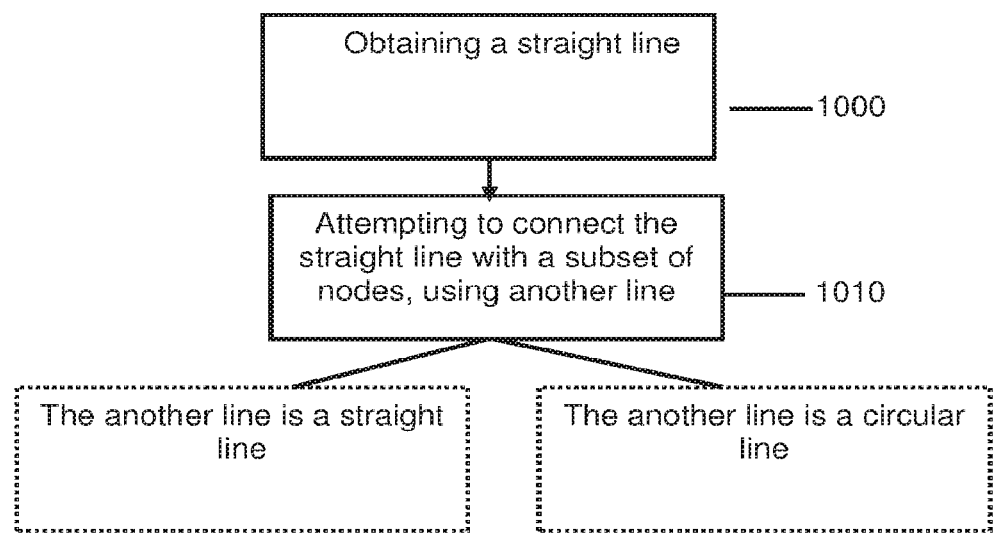
FIG. 10 illustrates a method of fitting a straight line with a subset of nodes, using a straight line or a circular line.

Attention is now drawn to FIG. 10, which describes a method of connecting a straight line with a subset of nodes (isolated nodes) on the grid.

The method can comprise obtaining at least one straight line $L_1$. This straight line $L_1$ can be obtained using e.g.:
  operation 310 described in FIG. 3 (creation of a straight line based on a node of the first plurality of nodes);
  operation 320 (fusion or concatenation of at least two different straight lines).

Assume a subset of nodes is located on the grid, and comprises one or more nodes of the first plurality of nodes. Assume the subset of nodes was not identified as being part of a straight line (for example because it did not comprise enough nodes to be considered as a straight line per se). According to some embodiments, if the straight line $L_1$ and the subset of nodes meet a criterion $C_2$, it can be attempted to fit the straight line $L_1$ and the subset of nodes with a common line. This common line merges the straight line and the subset of nodes.

According to some embodiments, the straight line $L_1$ and the subset of nodes match criterion $C_2$ if:
  the straight line $L_1$ and the subset of nodes are aligned, and
  a distance between an extremity of the straight line $L_1$ and the subset of nodes is below a threshold $D_{C2}$.

The threshold can be defined e.g. as a maximal number of nodes separating an extremity of the straight line $L_1$ and an extremity of the subset of nodes.

Figure 11:
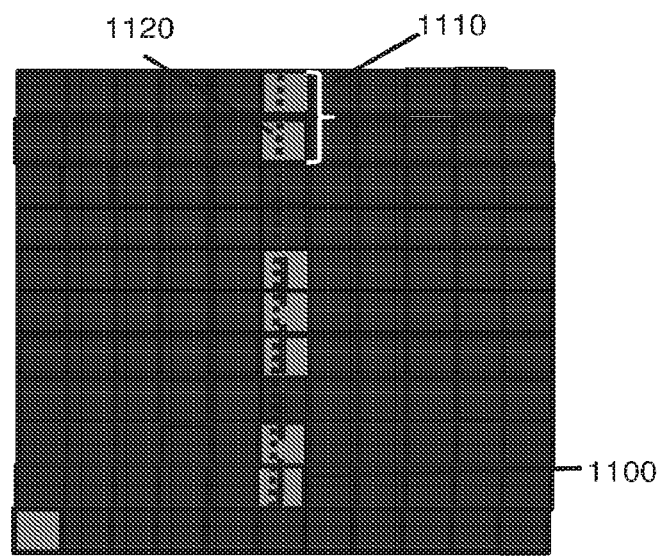
FIG. 11 illustrates a non-limitative example of fitting a straight line with a subset of nodes using a straight line.

A non-limiting example is provided in FIG. 11.

A straight line 1100 has been built on the grid. A subset of nodes 1110, comprising nodes of the first plurality of nodes, is present on the grid. The distance between an extremity of the straight line 1100 and an extremity of the subset of nodes 1110 is two nodes. Assume $D_{C2}$ is three nodes. As a consequence, the straight line 1100 and the subset of nodes 1110 meet criterion $C_2$, since:
  the subset of nodes and the straight line are aligned; and
  distance between the straight line and the subset of nodes is below $D_{C2}$.

A new straight line 1120 is built which fits both straight line 1100 and the subset of nodes 1110.

Although in FIG. 11 the subset of nodes was depicted as comprising only nodes of the first plurality of nodes, this is not limitative, and it can comprise nodes from both the first and second plurality of nodes.

According to some embodiments, the straight line $L_1$ and the subset of nodes match criterion $C_2$, if:
  the straight line $L_1$ and the subset of nodes are such that a circular line can fit at least part of the straight line $L_1$ and at least part of the subset of nodes.

In some embodiments, criterion $C_2$ can comprise a fitting criterion which defines to what extent the circular line has to fit the straight line $L_1$ and the subset of nodes. This fitting criterion can define e.g.:
  the maximal acceptable distance between the circular line and nodes of the straight line and of the subset of nodes. In some embodiments, this distance can be half a distance between two nodes of the grid, but this is not limitative; and
  the proportion of nodes which need to be located at this distance from the circular line. For example, it can be accepted that some nodes of the straight line or of the subset of nodes are not located within the maximal acceptable distance from the circular line. In some embodiments, it can be accepted that nodes located on the edge of the straight line, and belonging to the second plurality of nodes, are not located at this distance from the circular line.

Figure 12:
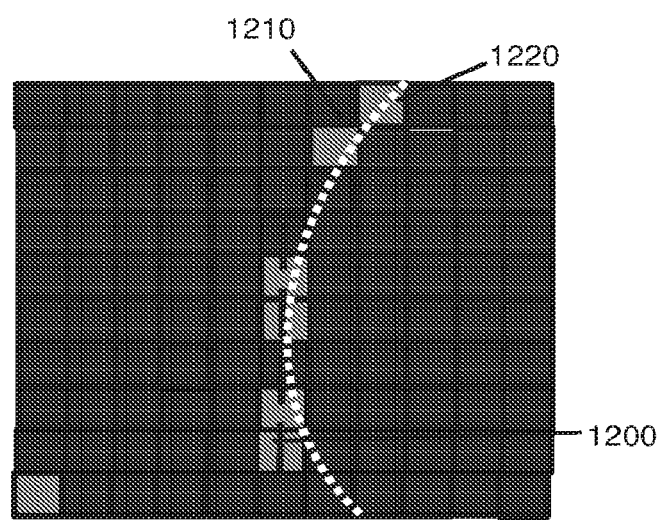
FIG. 12 illustrates a non-limitative example of fitting a straight line with a subset of nodes using a circular line.

A non-limiting example is provided in FIG. 12.

A straight line 1200 has been built on the grid. A subset of nodes 1210, comprising nodes of the first plurality of nodes, is present on the grid.

A circular line 1220 is built which fits, at least partially, the nodes of the straight line 1200 and the nodes of the subset of nodes 1210. This circular line meets criterion $C_2$ mentioned above.

Figure 13:
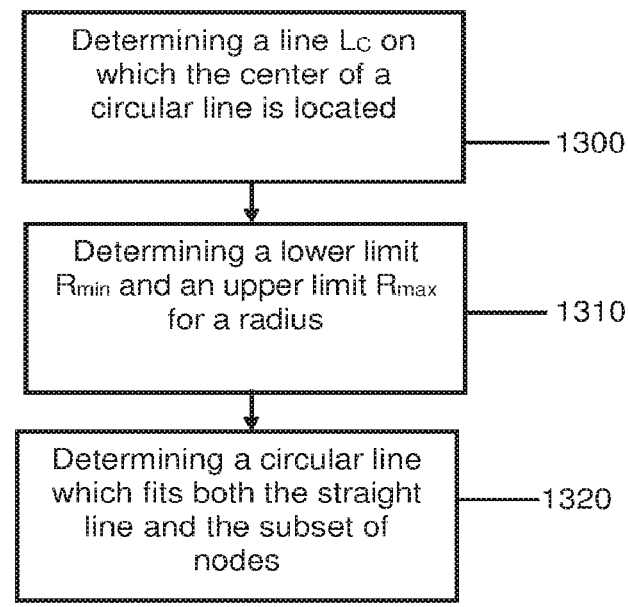
FIG. 13 illustrates a possible implementation of the method of FIG. 10.

Attention is drawn to FIG. 13 which describes a possible embodiment of a method of determining a circular line which fits nodes belonging to a straight line and a subset of nodes.

The method can comprise determining (operation 1300) a line $L_C$ which is orthogonal to the straight line and crosses a point located in the middle of the straight line.

The center of C the circular line is located on this line $L_C$.

The method can comprise determining (operation 1310) a lower limit $R_{min}$ and an upper limit $R_{max}$ for a radius of the circular line.

This determination can be performed e.g. as following. As mentioned above, the center C is assumed to be on line $L_C$.

Assume that the fitting criterion requires that the circular line is considered as fitting a node if the distance between the circular line and the node is below to or equal to D (for example D is equal to half a distance between two nodes of the grid).

A first circular line is built such that:
  the circular line has a center $C_1$ which is located on $L_C$, and
  the circular line has the maximal radius among all possible circular lines for which distance D is still met for nodes (all nodes, or in some embodiments, at least some of the nodes) of the straight line.

$R_{max}$ is set equal to radius of the first circular line.

A second circular line is built such that:
  the circular line has a center $C_2$ which is located on $L_C$, and
  the circular line has the minimum radius among all possible circles for which distance D is still met for nodes (all nodes, or in some embodiments, at least some of the nodes) of the straight line.

$R_{min}$ is set equal to radius of the second circular line.

In other words, the "extreme" circular lines are built, thereby limiting the number of possible circular lines that need to be tested afterwards to identify the best circular line.

Based on $R_{min}$ and $R_{max}$, a plurality of circular lines is tested (with a center located on $L_C$ between $C_1$ and $C_2$) until a circular line which fits best the straight line and the subset of nodes is found (operation 1320).

If no circular line is found, the method can attempt to fit the straight line with another subset of nodes, or with another straight line, or the method can attempt to fit another straight line with another adjacent straight line or with another subset of nodes.

Figure 13A:
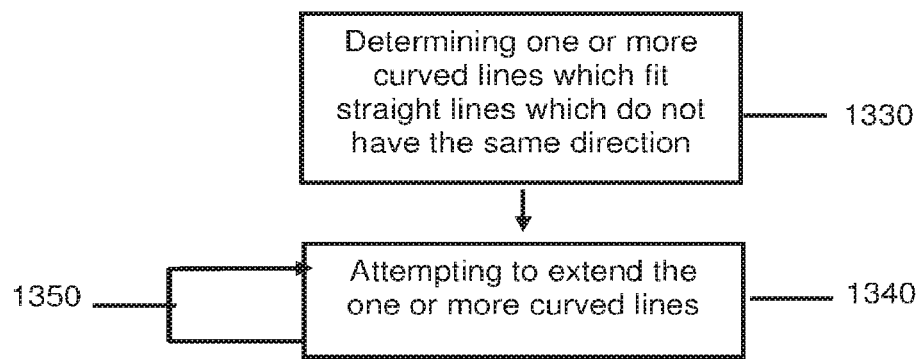
FIG. 13A illustrates a method in which it is attempted to extend circular lines.

Attention is now drawn to FIG. 13A.

According to some embodiments, once a given circular line has been determined (operation 1330), the method can comprise an operation in which it is attempted to extend this given circular line (operation 1340).

In particular, if additional nodes of the first plurality of nodes are located in the vicinity of an extremity of the given circular line (according to a proximity criterion—examples of proximity criterion have been provided above), it can be attempted to extend the given circular line to fit also these additional nodes.

These additional nodes can be in particular nodes which do not belong to any straight or circular lines that were determined previously, but this is not mandatory.

According to some embodiments, extension of the given circular line can be carried out e.g. by extending the given circular line using its equation, and determining if the fitting criterion is still met when taking into account the additional nodes. If the fitting criterion is still met, then these additional nodes can be associated to this extended circular line.

According to some embodiments, extension of the given circular line can be carried out by determining a new circular line which fits both nodes representative of associated with the given circular line, and the additional nodes, according to a fitting criterion. In other words, is it not the given circular line which is extended to pass through these additional nodes, but rather a new circular line (with a new equation) is determined by taking into account the presence of these additional nodes. Determination of this new circular line can be carried out similarly to what was explained above for fitting two lines, which are not on the same direction, with a circular line.

The process of extending the circular line can be repeated iteratively (see arrow 1350). Therefore, it can be attempted to extend again the new circular line, in order to fit additional nodes located in the vicinity of an extremity of the new circular line.

Various embodiments of determining lines on the grid have been described. These various embodiments can be combined.

For example, assume a straight line has been identified based on the fusion of two straight lines, or based on the fusion of a straight line with a subset of nodes. Then, this new straight line can be used to be:
- fused with other straight line, or
- fused with another subset of nodes, or
- fitted with another subset of nodes (using a circular line), or
- fitted with another straight line (using a circular line).

For example, if a circular line has been identified based on the fitting of two straight lines, or on the fitting of a straight line with a subset of node, then, this new circular line can be used to be:
- fitted with another subset of nodes (using another circular line), or
- fitted with another straight line (using another circular line).

Figure 14:
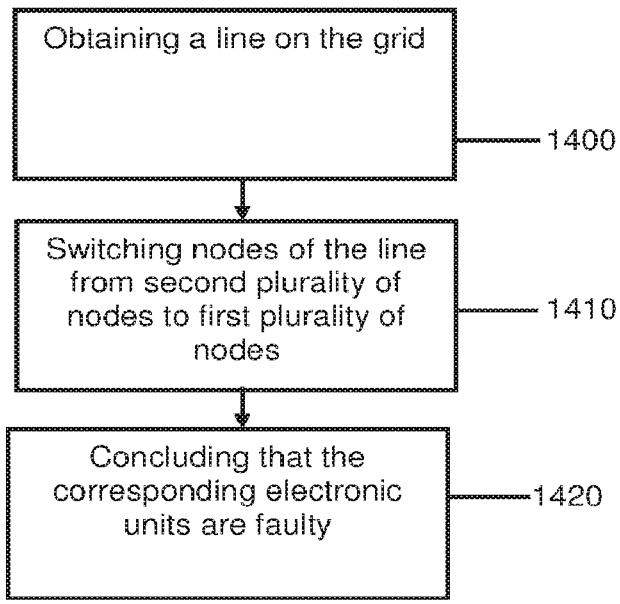
FIG. 14 illustrates a method of detecting faulty electronic units based on the lines determined on the grid.

Attention is now drawn to FIG. 14.

According to some embodiments, once a given line (straight line, or circular line, as explained in the various embodiments described above) has been identified on the grid (operation 1400), several operations can be performed.

According to some embodiments, nodes associated with the given line, and which originally belonged to the second plurality of nodes (operational electronic units) can be assigned to the first plurality of nodes (operation 1410). Indeed, the given line is generally considered as a representation of faulty electronic units (for example due to the presence of a scratch).

Nodes which are associated with the given line can include the following nodes:
- for a straight line, this can include nodes which are located on the straight line;
- for a circular line, this can include nodes which are located on the circular line, and nodes which are located at a distance of the circular line which complies with the fitting criterion (for example, as mentioned above, in some embodiments, nodes located at a distance which is equal to, or below half distance between two nodes of the grid, can be associated with the circular line).

In other words, it is considered that although these nodes represent electronic units which are associated with test data which match a test criterion, since they are present on the given line, they are probably faulty. Therefore, these nodes are switched from the second plurality of nodes to the first plurality of nodes. It is thus possible to assess which electronic units are most likely faulty on the electronic assembly (operation 1420).

In some embodiments, this can be taken into account in subsequent operations. For example, when attempting to build new lines, these nodes will be considered as belonging to the first plurality of nodes and not to the second plurality of nodes.

Figure 15:
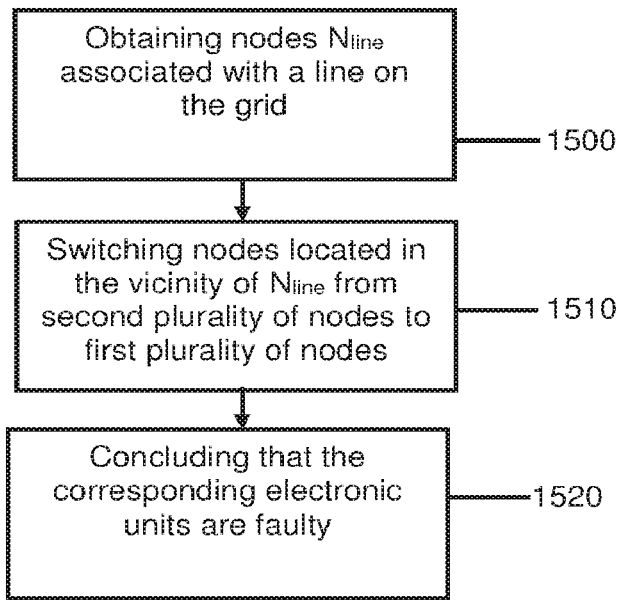
FIG. 15 illustrates a method of detecting additional faulty electronic units based on the lines determined on the grid.

Attention is drawn to FIG. 15.

Assume a given line has been identified on the grid. A plurality of nodes (hereinafter nodes $N_{line}$) are associated with this given line (reference 1500 in FIG. 15).

As mentioned above, the nodes which previously belonged to the second plurality of nodes are assigned to the first plurality of nodes because they are associated with this given line (which probably represents defects present in the electronic assembly, such as a scratch).

The method can comprise assigning all nodes (belonging to the second plurality of nodes) of the grid which are located in the vicinity of nodes $N_{line}$ to the first plurality of nodes (operation 1510).

The proximity criterion can define e.g. that each node located at a distance which is equal to or below the distance between two nodes of the grid is considered as being in the vicinity of nodes $N_{line}$.

In other words, this means that each node located in the vicinity of nodes associated with the given line is considered also as representative of a faulty electronic unit. Indeed, when electronic units are faulty due e.g. to the presence of a scratch, there is a probability that all adjacent electronic units are also defective due to the scratch (since a scratch generally affects a certain width of electronic units on the grid).

It is thus possible to assess which electronic units are most likely faulty on the electronic assembly (operation 1520).

Figure 16:
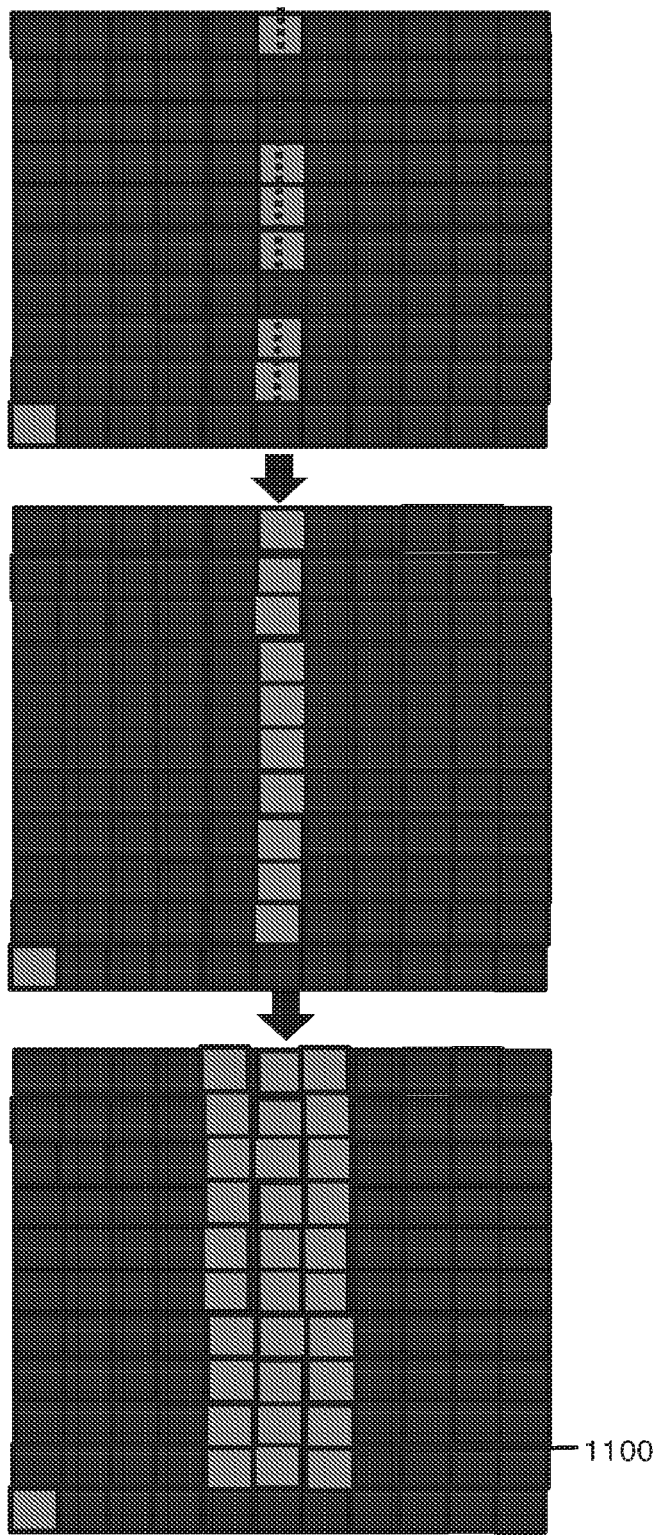
FIG. 16 illustrates an example of building a line to detect defects on the line and in the vicinity of the line.

A non-limitative example of the method of FIGS. 14 and 15 is provided in FIG. 16.

As shown, a straight line 1600 has been identified.

This straight line 1600 comprises nodes of the first plurality of nodes and nodes of the second plurality of nodes.

As explained with reference to FIG. 14, the nodes of the straight lines which belong to the second plurality of nodes are now assigned to the first plurality of nodes.

As explained with reference to FIG. 15, the nodes of the grid which are in the vicinity of the nodes of the first straight line, are assigned to the first plurality of nodes.

Therefore, faulty electronic units of the electronic assembly can be identified accordingly, based on the first plurality of nodes identified on the grid.

Figure 17:
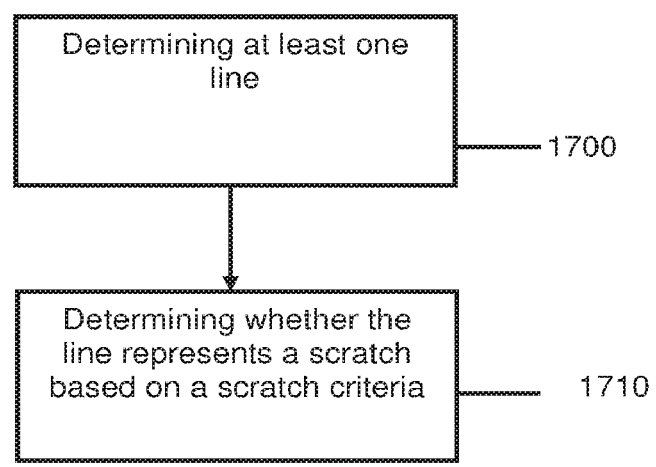
FIG. 17 illustrates a method of detecting a scratch.

Attention is now drawn to FIG. 17.

The different lines that are identified on the grid (operation 1700) can be used to identify one or more scratches on the grid.

According to some embodiments, a straight line is considered as a scratch if it meets a first scratch criterion (operation 1710).

According to some embodiments, the first scratch criterion is a number of nodes (irrespective of whether they belong to the first or second plurality of nodes).

Therefore, if the straight line comprises a total number of nodes which is above the first scratch criterion, the method can determine that this straight line corresponds to a scratch.

According to some embodiments, the first scratch criterion is a number of nodes of the first plurality of nodes.

Therefore, if the straight line comprises a number of nodes belonging to the first plurality of nodes and which is above the first scratch criterion, the method can determine that this straight line corresponds to a scratch.

The number of nodes in the scratch criterion may be determined depending on at least one of:
a total number of electronic units on the substrate;
a physical size of the electronic units; and
characteristics of the fabrication process.

For example, for substrates with large number of electronic units, the number of nodes in the scratch criterion can be increased and for substrates with large electronic units this number may be decreased.

In another example, if it is know that a fabrication equipment may create larger scratches, then the number may be increased.

These examples are however not limitative.

According to some embodiments, a circular line is considered as a scratch if it meets a second scratch criterion (operation 1710).

According to some embodiments, the second scratch criterion is a number of nodes or of electronic units (irrespective of whether they belong to the first or second plurality of nodes).

Therefore, if the circular line comprises a total number of nodes/electronic units (both from the first and second plurality of nodes) which is above the second scratch criterion, the method can determine that this circular line corresponds to a scratch.

According to some embodiments, the second scratch criterion is a number of nodes or of electronic units of the first plurality of nodes.

Therefore, if the circular line comprises a number of nodes/electronic units of the first plurality of nodes which is above the second scratch criterion, the method can determine that this circular line corresponds to a scratch.

Various examples have been provided above for determining the first scratch criterion, and these examples apply similarly for the second scratch criterion and are thus not repeated.

An output can be provided to the operator, such as on a display, in which an identified scratch can be represented e.g. by appropriate lines on a map, or on a picture of the electronic assembly.

According to some embodiments, once electronic units are identified as belonging to a scratch, they can be associated with data representative of this status.

According to some embodiments, once electronic units are identified as belonging to a scratch, they (or the nodes representative of these electronic units) can be removed from the grid, and/or ignored when attempting to detect a new scratch.

According to some embodiments, the method of detecting a scratch can be repeated, using an updated grid. This updated grid can correspond e.g. to the original grid from which electronic units (or the nodes representative of these electronic units) identified as belonging to a scratch, are removed, or in which electronic units (or the nodes representative of these electronic units) identified as belonging to a scratch, are ignored.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. A method of identifying defects in an electronic assembly, comprising, by a processing unit:
obtaining a grid of nodes representative of a location of electronic units of an electronic assembly, wherein each node is representative of an electronic unit and is neighboured by at most eight other nodes,
wherein a first plurality of nodes represents failed electronic units according to at least one test criterion, and a second plurality of nodes represents passing electronic units according to the least one test criterion,
based on the grid, determining for at least one first node of the first plurality of nodes, at least one first straight line which:
is oriented along a direction on the grid out of four possible directions,
includes the first node and nodes of at least the first plurality of nodes, and
matches a first criterion,
based on the grid, determining for at least one second node of the first plurality of nodes, at least one second straight line which:
is oriented along a direction on the grid out of four possible directions,
includes the second node and nodes of at least the first plurality of nodes, and
matches the first criterion,
wherein if the first straight line and the second straight line match a second criterion, determining a third line which fits at least part of the first line and at least part of the second line according to a fitting criterion, thereby identifying, based on this third line, a subset of nodes, and wherein if at least one node from the subset of nodes belongs to the second plurality of nodes, concluding that an electronic unit represented by the at least one node on the grid is a failed electronic unit, thereby facilitating identification of a failed electronic unit of the electronic assembly.

2. The method of claim 1, wherein a line can meet the first criterion only if data representative of a number of nodes included in the line and belonging to the first plurality of nodes is above a threshold.

3. The method of claim 1, wherein the first line and the second line match the second criterion if:
the first straight line and the second straight line tire aligned, wherein the third line is a straight line joining or merging the first straight line and the second straight line, or
the first straight line and the second straight line are located on the grid such that a circular line can fit at least part of the first straight line and at least part of the second straight line.

4. The method of claim 1, wherein a node meets the fitting criterion if:
the node is located on the third line, or
the node is located at a distance of the third line which is below or equal to a half of a distance between two nodes of the grid.

5. The method of claim 1, comprising:
determining a second subset of nodes set comprising one or more nodes which are located in the vicinity of the subset of nodes according to a proximity criterion,
if at least one node belongs both to the second plurality of nodes and to the second subset of nodes, concluding that an electronic unit represented by the node on the grid is a failed unit.

6. The method of claim 1, wherein the third line is a circular line, wherein determination of the third line comprises:
determining a lower limit $R_{min}$ and an upper limit $R_{max}$ for a possible radius of the third line, and
determining the third line as a circular line which fits the first and second straight lines according to the fitting criterion and has a radius between $R_{min}$ and $R_{max}$.

7. The method of claim 6, the method further comprising:
determining a center C of the third line, the center corresponding to an intersection between:
a line orthogonal to the first straight line and crossing a point located in the middle of the first straight line, and
a line orthogonal to the second straight line and crossing a point located in the middle of the second straight line, and
determining the third line based on C, $R_{min}$ and $R_{max}$, such as it fits at least part of the first straight line and the second straight line according to the fitting criterion.

8. The method of claim 1, wherein the third line is a circular line, wherein the fitting criterion is relaxed for nodes of the second plurality of nodes which are located on an edge of the first straight line or of the second straight line with respect to other nodes of the first straight line or of the second straight line.

9. The method of claim 1, the method further comprising detecting whether a scratch is present on the electronic assembly based at least on the third line.

10. A method of identifying defects in an electronic assembly, comprising, by a processing unit:
obtaining a grid of nodes representative of a location of electronic units on an electronic assembly, wherein each node is representative of an electronic unit and is neighboured by at most eight other nodes,
wherein a first plurality of nodes represents failed electronic units according to at least one test criterion, and a second plurality of nodes represents passing electronic units according to the at least one test criterion,
based on the grid, determining for at least one first node of the first plurality of nodes, at least one first straight line which:
is oriented along a direction on the grid out of four possible directions,
includes the first node and nodes of at least the first plurality of nodes, and
matches a first criterion,
if the first straight line, and a subset of nodes of the first plurality of nodes match a second criterion, determining a third line which fits at least part of the first line and at least part of the subset of nodes according to a fitting criterion, thereby identifying, based on this third line, a group of nodes, and
wherein if at least one node from this group of nodes belongs to the second plurality of nodes, concluding that an electronic unit represented by the node on the grid is a failed electronic unit, thereby facilitating identification of a failed electronic unit of the electronic assembly.

11. The method of claim 10, wherein a line can meet the first criterion only if at least data representative of a number of nodes included in the line and belonging to the first plurality of nodes is above a threshold.

12. The method of claim 10, wherein the first line and the subset of nodes match the second criterion if:
the first straight line and the subset of nodes are aligned, and a distance between an extremity of the first straight line and the subset of nodes is below a threshold, wherein the third line is a straight line joining or merging the first straight line and the subset of nodes, or
the first straight line and the subset of nodes are such that a circular line can fit at least part of the first straight line and at least part of the subset of nodes.

13. The method of claim 10, wherein a node meets the fitting criterion if:
the node is located on the third line, or
the node is located at a distance of the third line which is below or equal to a half of a distance between two nodes of the grid.

14. The method of claim 10, the method further comprising:
determining a second subset of nodes set comprising one or more nodes which are located in the vicinity of the subset of nodes according to a proximity criterion,
if at least one node belongs both to the second plurality of nodes and to the second subset of nodes, concluding that an electronic unit represented by the node on the grid is a failed unit.

15. The method of claim 10, wherein the third line is a circular line, herein determination of the third line comprises:
determining a lower limit $R_{min}$ and an upper limit $R_{max}$ for a possible radius of the third line, and determining the third line as a circular line which fits the first and second straight lines according to the fitting criterion and has a radius between $R_{min}$ and $R_{max}$.

16. The method of claim 15, the method further comprising:
determining a line L orthogonal to the first straight line and crossing a point located in the middle of the first straight line, wherein a center C of the third line is located on the line L, and
determining the third line based on L, $R_{min}$ and $R_{max}$, such as it fits at least part of the first line and the subset of nodes according to the fitting criterion.

17. The method of claim 10, wherein the third line is a circular line, wherein the fitting criterion is relaxed for nodes of the second plurality of nodes which are located on an edge of the first straight line with respect to other nodes of the first straight line.

18. The method of claim 10, the method further comprising detecting whether a scratch is present on the electronic assembly based at least on the third line.

19. The method of claim 10, wherein the electronic assembly is an electronic substrate.

20. A non-transitory storage device readable by a machine, tangibly embodying a program of instructions executable by the machine to perform a method of identifying defects in an electronic assembly, comprising:
obtaining a grid of nodes representative of a location of electronic units of an electronic assembly, wherein each node is representative of an electronic unit and is neighboured by at most eight other nodes,
wherein a first plurality of nodes represents failed electronic units according to at least one test criterion, and a second plurality of nodes represents passing electronic units according to the at least one test criterion,
based on the grid, determining for at least one first node of the first plurality of nodes, at least one first straight line which:
is oriented along a direction on the grid out of four possible directions,
includes the first node and nodes of at least the first plurality of nodes, and
matches a first criterion,
if the first straight line, and a subset of nodes of the first plurality of nodes match a second criterion, determining a third line which fits at least part of the first line and at least part of the subset of nodes according to a fitting criterion, thereby identifying, based on this third line, a group of nodes, and
wherein if at least one node from this group of nodes belongs to the second plurality of nodes, concluding that an electronic unit represented by the at least one node on the grid is a failed electronic unit, thereby facilitating identification of a failed electronic unit of the electronic assembly.

\* \* \* \* \*

UNITED STATES PATENT AND TRADEMARK OFFICE
CERTIFICATE OF CORRECTION

| | | |
|---|---|---|
| PATENT NO. | : 11,852,684 B2 | |
| APPLICATION NO. | : 18/194264 | |
| DATED | : December 26, 2023 | |
| INVENTOR(S) | : Leonid Gurov et al. | |

It is certified that error appears in the above-identified patent and that said Letters Patent is hereby corrected as shown below:

In the Claims

Claim 15, Column 26, Line 64, please delete "herein" and add "wherein" after - circular line, -.

Signed and Sealed this
Twelfth Day of March, 2024

Katherine Kelly Vidal
*Director of the United States Patent and Trademark Office*